United States Patent
Bulthuis

(10) Patent No.: US 6,494,381 B2
(45) Date of Patent: Dec. 17, 2002

(54) COOLING FAN IN SYNC WITH AUDIO OUTPUT LEVEL

(75) Inventor: Willem Bulthuis, Mountain View, CA (US)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/746,030

(22) Filed: Dec. 21, 2000

(65) Prior Publication Data

US 2002/0079375 A1 Jun. 27, 2002

(51) Int. Cl.[7] .............................. F24F 7/00; G08B 1/00
(52) U.S. Cl. ........................ 236/49.3; 181/141; 454/184
(58) Field of Search .......................... 236/49.3; 62/259, 62/2; 454/184; 165/80.3; 181/141

(56) References Cited

U.S. PATENT DOCUMENTS

| 5,010,739 A | * | 4/1991 | Isshiki et al. ............. 62/296 X |
|---|---|---|---|
| 5,249,741 A | | 10/1993 | Bistline et al. |
| 5,769,705 A | | 6/1998 | O'Callaghan et al. |
| 5,864,465 A | | 1/1999 | Liu ............................. 361/697 |
| 5,870,614 A | | 2/1999 | Ang |
| 5,963,887 A | | 10/1999 | Giorgio |
| 6,285,150 B1 | * | 9/2001 | Adam et al. ................ 318/471 |
| 6,290,140 B1 | * | 9/2001 | Pesko et al. ............. 236/47 X |

FOREIGN PATENT DOCUMENTS

| DE | 3702952 A1 | 8/1988 |
|---|---|---|
| DE | 4140505 A1 | 6/1992 |
| JP | 09190244 A | 7/1997 |

* cited by examiner

Primary Examiner—William Wayner
(74) Attorney, Agent, or Firm—Laurie E. Gathman

(57) ABSTRACT

A method and device for controlling a cooling fan within an electronic device based on the temperature within the electronic device and the audio output level of the electronic device and/or the ambient noise level.

14 Claims, 4 Drawing Sheets

COOLING FAN IN SYNC WITH AUDIO OUTPUT LEVEL

FIELD OF THE INVENTION

The invention relates in general to cooling fans used in electronic devices and in particular to cooling fans which are controlled in part based on the audio output level of the electronic device and/or the ambient noise level.

BRIEF DESCRIPTION OF THE PRIOR ART

The power dissipated during operational use of an electronic circuit reveals itself as heat. The heat generated by an integrated circuit typically increases with increasing transistor density and with increasing clock frequency. The eventual temperature of a semiconductor substrate in a stationary state is determined by the balance between the heat generated and the heat carried off of the substrate. A conventional way to handle excessive heat is providing forced cooling using a fan.

The problem with using a fan is that a fan is typically turned on and left on during operation of the electronic device causing fan noise to interfere with the playing of music or other audio or the general quiet of an environment in which the device is used. Certain circuits requiring cooling however, tend to operate in bursts. That is, the circuit may alternatively remain idle for a period of time and then operate at its maximum or near maximum capacity for another period of time. In fact depending on the audio output of the computer, the fan noise can be quite annoying, such as when trying to listen to a CD. At other times during computationally intensive activities, such as a computer game that can be quite loud, the fan is hardly detectable in the background noise.

SUMMARY OF THE INVENTION

Accordingly, it is an object of the invention to provide a cooling fan control mechanism that is responsive to heat generated within the electronic device and/or semiconductor substrate as well as being responsive to the audio output of the electronic device.

It is another object of the invention to control the cooling fan based on the heat generated within the electronic device and/or semiconductor and the ambient noise.

A DETAILED DESCRIPTION OF THE PREFERRED EMBODIMENTS

Figure 1:
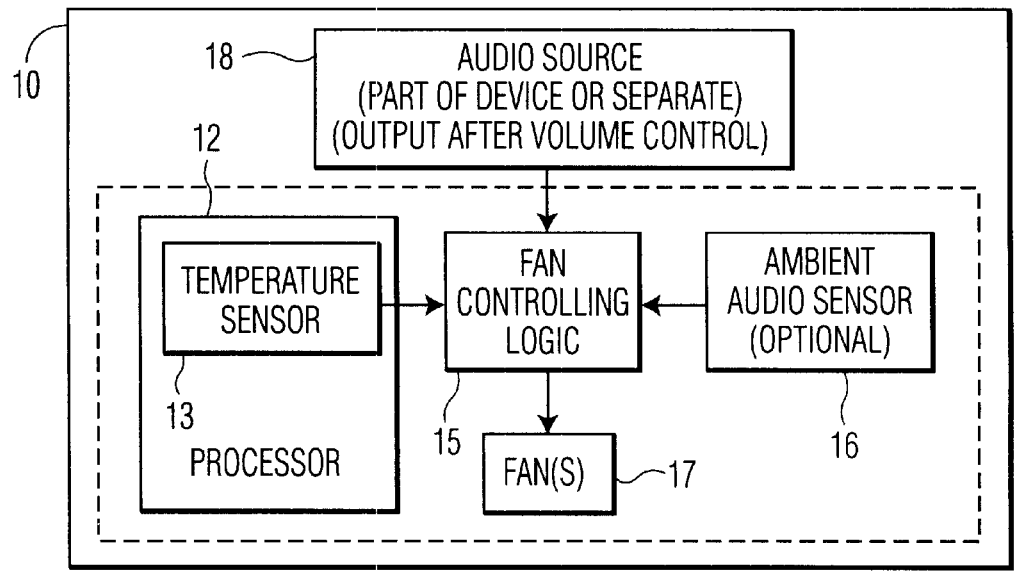
FIG. 1 is a block diagram of an embodiment of the instant invention.
Figure 2A:
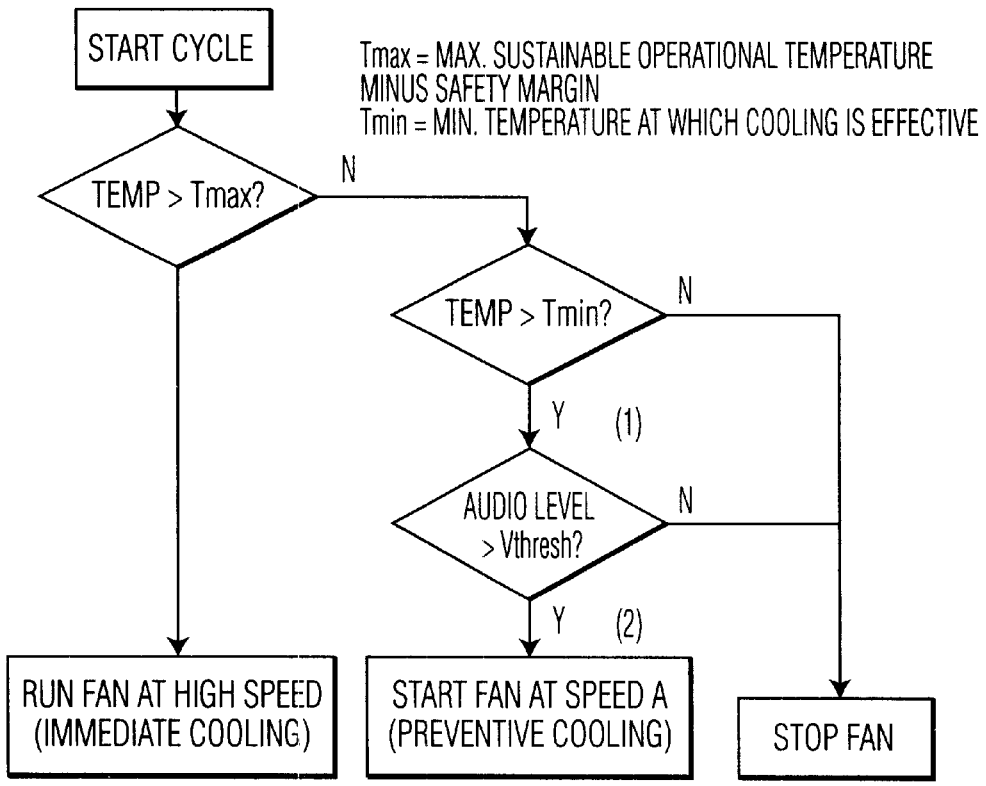
FIGS. 2a and 2b are flow charts describing embodiments of the instant invention.

A temperature sensor is described in U.S. Pat. No. 5,870,614 incorporated herein by reference. FIG. 1 shows a block diagram in accordance with a first embodiment of the invention. An electronic device such as a PC or home audio equipment 10 is provided with a processor 12, having a temperature sensor 13, fan controlling logic 15, a fan 17 and an audio source 18 (internal or external). The fan is controlled by logic circuitry 15 which receives inputs from the temperature sensor 13 and the audio source 18. Logic circuitry 15 can also be replaced by a microcontroller, microprocessor or other processor or software running such processor. FIG. 2A shows a flow chart of the operation of the embodiment in FIG. 1.

Temperature sensor 13 can be integrated in a semiconductor substrate or for example a processor 12 or located somewhere else within the electronic circuit. For ease of explanation it will be assumed that the temperature sensor 13 is located within the substrate. Temperature sensor 13 provides a signal indicative of the local substrate temperature of the processor 12 to the fan controlling logic 15. The audio source 18 provides an audio output to fan controlling logic 15. An ambient noise sensor 16 provides an input to the fan controlling logic 15. The fan 17 is located within the electronic device and its speed can be controlled by the fan controlling logic 15.

The fan 17 is an important part of any electronic device since it keeps the electronic device or semiconductor substrate below the maximum sustainable operational temperature minus a safety margin (Tmax). There is also a temperature below which the fan is not effective (Tmin). In one embodiment of the present invention, if the fan controlling logic 15 detects that the temperature sensor 13 is above Tmax it automatically turns the fan 17 "ON" to assure necessary cooling. If the fan controlling logic 15 detects that the temperature sensor 13 is below Tmax but above Tmin then the instant invention monitors the audio source which provides the audio output of the device. If the audio signal is higher than some threshold VThresh then the fan can remain ON because it will not disturb a user of the device. If the fan logic 15 detects that the audio signal is very low and the temperature sensor is below Tmax then the fan is turned OFF until the temperature sensor reaches Tmax, to avoid disturbing the user.

Accurate monitoring of the temperature is required in this invention as described, for example, in U.S. Pat. No. 5,870,614. The temperature sensor 13 should therefore be sensitive and accurate enough in the critical temperature range to allow close tracking of the temperature. Preferably, temperature sensor 13 is operative to provide a sensor voltage indicative of the temperature sensed.

Figure 2B:
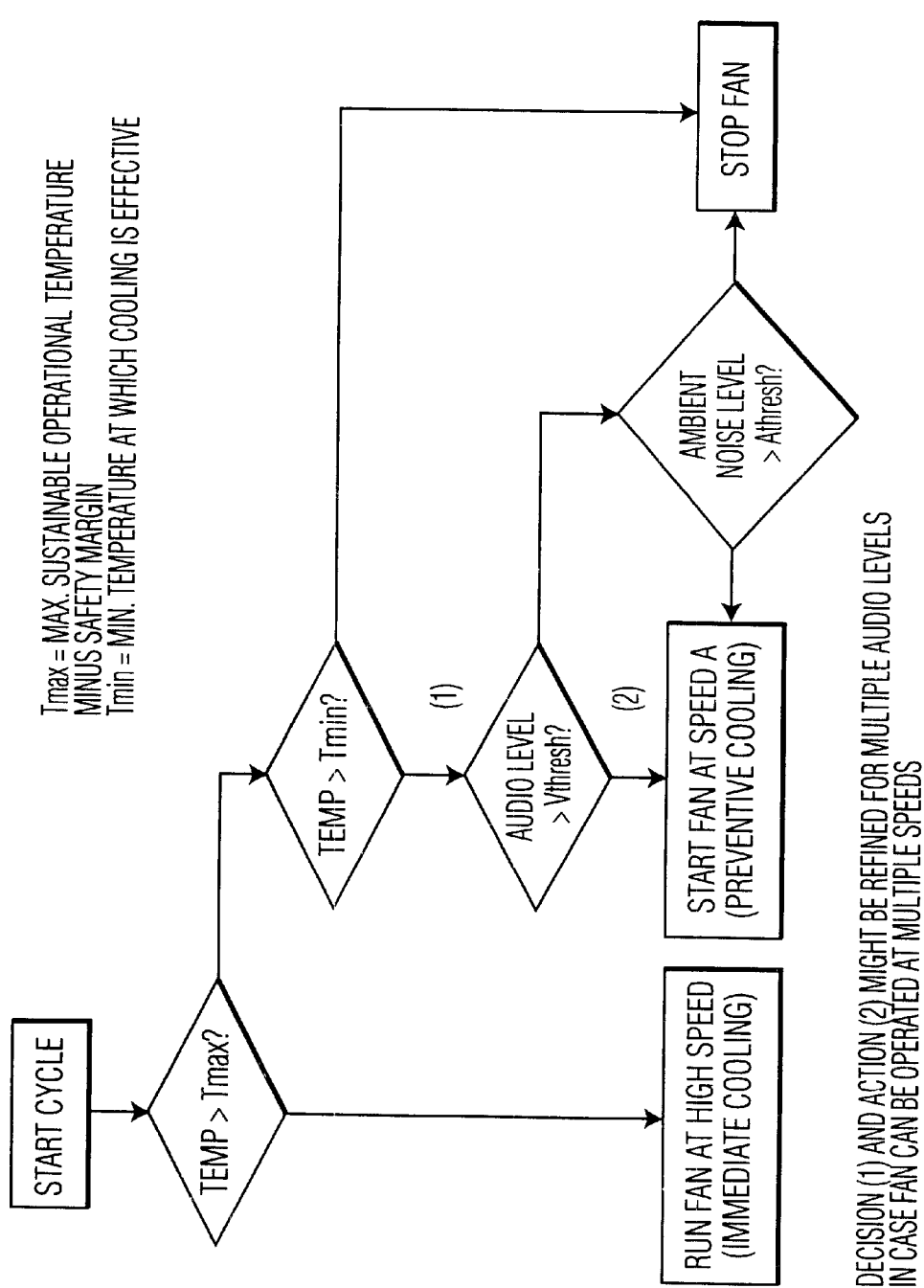

FIG. 2b shows a flow chart of an alternative embodiment of the invention which also measures the ambient noise level. Initially the temperature sensor 13 is monitored to see if the semiconductor temperature is above a dangerous level which may lead to failure, Tmax. If the temperature sensor 13 indicates that the heat level is above Tmax, the cooling fan 17 is turned ON. If the temperature sensor 13 indicates that the heat level is below Tmax the fan controlling logic 15 then checks to see if the temperature is above the minimum level at which cooling is effective Tmin. If not the fan 17 is turned OFF. If the temperature is above Tmin the audio signal level 18 of the device is monitored. If the audio output 18 is high then it is not necessary to check the ambient noise level 16 since the sound of the fan 17 will probably not be disturbing to a user of the PC. If the audio signal 18 of the device is below VThresh then the ambient noise level 16 is checked to see if it is below a certain level AThresh. If the ambient noise level 16 and the audio output 18 are low then the fan is turned OFF to avoid disturbing a user. If the ambient noise level 16 is high and the audio output 18 is low then the fan 17 can remain ON.

In an alternative embodiment, the fan is controlled purely on the basis of the ambient noise level and the heat sensor.

If the ambient noise level is greater than AThresh then the fan can remain on without disturbing a user. If the ambient noise level is less than AThresh and the temperature sensor is below Tmax then the fan is turned OFF until the temperature sensor reaches Tmax, to avoid disturbing the user.

Figure 3:
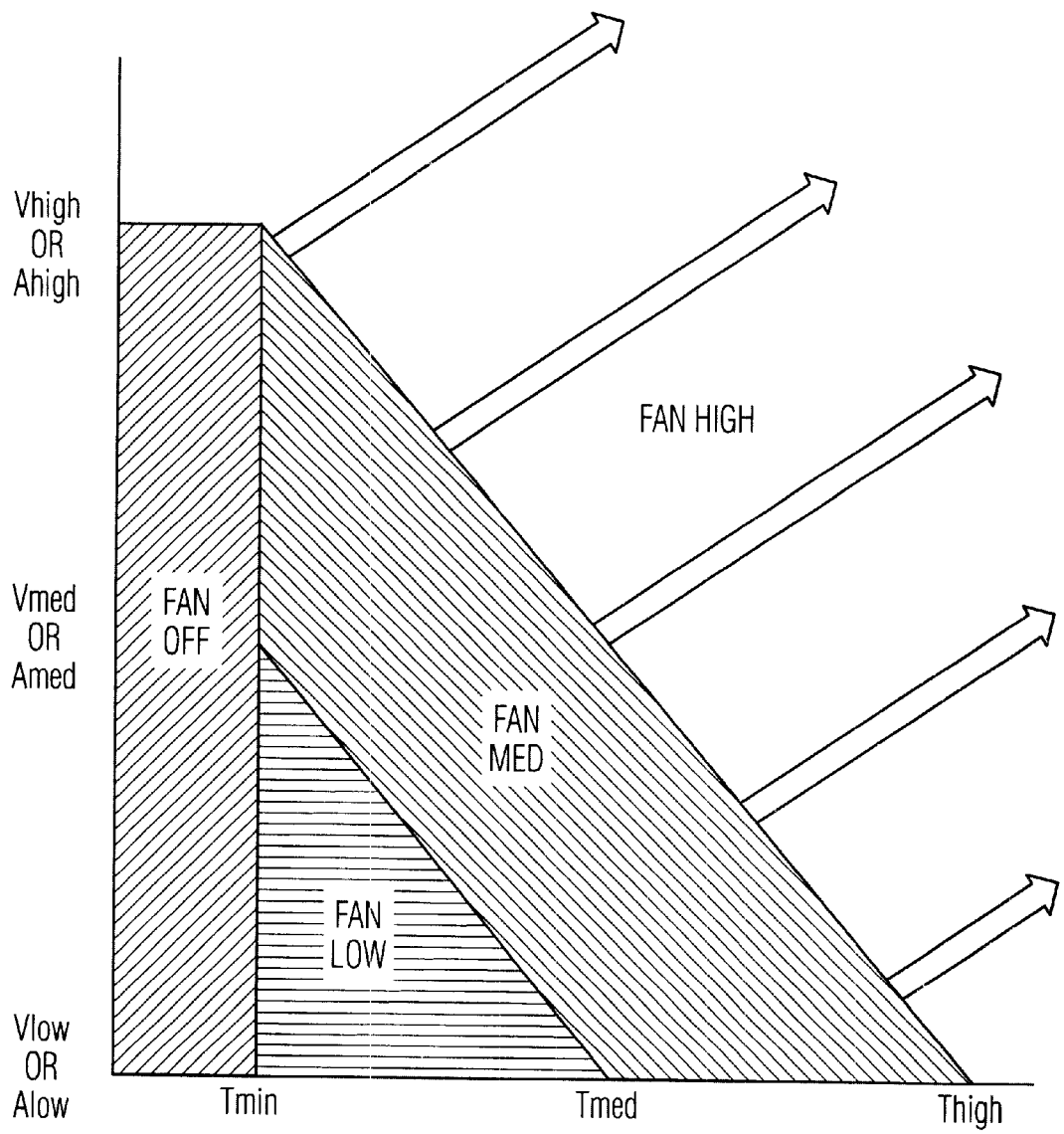
FIG. 3 is a graph of the fan speed V.S. temperature and audio levels.

FIG. 3 shows a graph of a third embodiment of the invention which also controls the fan speed. In this embodiment the fan speed is variably controlled based on the audio output level and the temperature of the semiconductor or device. (This graph also applies to the embodiment which controls the fan speed based on temperature and ambient noise level only.) In this case if the temperature of the semiconductor or device is at Tmin or less, the fan is always OFF. If the temperature of the semiconductor or device is less than Tmax then the audio source signal level is monitored. If the audio signal level is above Amax then the fan is on high speed and/or ambient noise level. If the temperature level is between Tmed and Tmax and the audio signal is less than Ahigh and greater than Vmed then the fan is run at medium speed. If the temperature level is less than Tmed and greater than Tmin and the audio output level is below Vmed then the fan is run on low speed. Obviously these levels can be partitioned for even more fan speeds. Similarly the variable fan can also be used in conjunction with the ambient noise level measurements.

Figure 4:
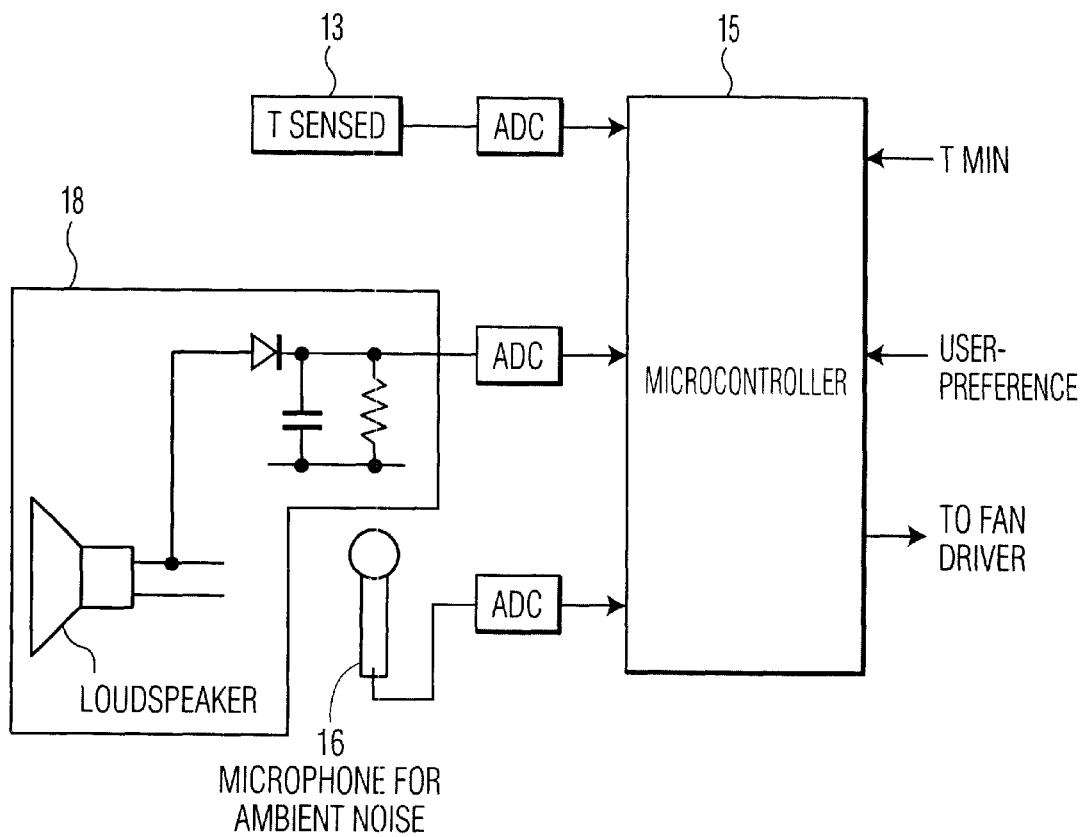
FIG. 4 shows a more detailed diagram of the fan controlling logic.

FIG. 4 shows a microcontroller based system. In this system a temperature sensor 13 provides the temperature to the microcontroller 15. The audio sensor 18 is also an input to the microcontroller as well as the ambient noise sensor 16. The microcontroller can be set to either monitor the audio signal output and/or the ambient noise sensor. The signals for the temperature, audio output level and ambient noise are detected by analog circuitry and converted by analog to digital converters (ADC's) into digital quantities. These digital quantities are supplied to a microcontroller 15 where the actual control signals for the fan's drives are generated using software.

While the invention has been described in connection with preferred embodiments, it will be understood that modifications thereof within the principles outlined above will be evident to those skilled in the art and thus, the invention is not limited to the preferred embodiments but is intended to encompass such modifications.

What is claimed is:

1. A cooling fan system in an electronic device, comprising:

a temperature sensor which measures the temperature within the electronic device;

an audio device which measures the audio level produced by the electronic device; and a processor which receives the output of the temperature sensor and the output of the audio device and for controlling the cooling fan based on the audio device and temperature sensor outputs.

2. The cooling fan system as claimed in claim 1, further including an ambient noise sensor which measures the ambient noise level and wherein the processor receives the output of the ambient noise sensor and controls the cooling fan based on the audio level of the electronic device optical, the temperature sensor and the ambient noise sensor output.

3. The cooling fan system as claimed in claim 1 or 2, wherein the temperature sensor measures the temperature of an integrated circuit within the electronic device.

4. A personal computer, comprising:

a temperature sensor which measures the temperature within the personal computer;

an audio device which measures the audio level produced by the personal computer; and a processor which receives the output of the temperature sensor and the output of the audio device and for controlling the cooling fan based on the audio and temperature sensor outputs.

5. The personal computer as claimed in claim 4, further including an ambient noise sensor which measures the ambient noise, and wherein the processor receives the output of the ambient noise sensor and controls the cooling fan based on the audio level of the personal computer, the temperature sensor and the ambient noise sensor output.

6. The personal computer as claimed in claim 4, wherein the temperature sensor measures the temperature of an integrated circuit within the electronic device.

7. An electronic device, comprising a temperature sensor which measures the temperature within the electronic device;

an audio device which measures the audio level produced by the electronic device; and a processor which receives the output of the temperature sensor and the output of the audio device and for controlling the cooling fan based on the audio level of the electronic device and temperature sensor output.

8. The electronic device as claimed in claim 7, further including an ambient noise sensor which measures the ambient noise, and wherein the processor receives the output of the ambient noise sensor and controls the cooling fan based on the audio level of the electronic device, the temperature sensor and the ambient noise sensor output.

9. A method of controlling a cooling fan in an electronic device, comprising the steps of:

measuring the temperature within the electronic device;

measuring the audio level of the electronic device; and controlling the cooling fan based on the audio level and the temperature.

10. The method as claimed in claim 9, further comprising the steps of: measuring the ambient noise level; and controlling the cooling fan based on the ambient noise level as well.

11. The method as claimed in claims 9 or 10, wherein the step of measuring the temperature within the electronic device, measures the temperature of an integrated circuit within the electronic device.

12. A consumer electronics device, comprising:

a temperature sensor which measures the temperature within the electronic device;

an audio device which measures the audio level produced by the electronic device; and a processor which receives the output of the temperature sensor and the output of the audio device and for controlling the cooling fan based on the audio device and temperature sensor outputs.

13. A consumer electronics device as claimed in claim 12, further including an ambient noise sensor which measures the ambient noise level and wherein the processor receives the output of the ambient noise sensor and controls the cooling fan based on the audio level of the electronic device optical, the temperature sensor and the ambient noise sensor output.

14. A consumer electronics device as claimed in claim 12 or 13, wherein the temperature sensor measures the temperature of an integrated circuit within the electronic device.

* * * * *

UNITED STATES PATENT AND TRADEMARK OFFICE
CERTIFICATE OF CORRECTION

PATENT NO.    : 6,494,381 B2
DATED         : December 17, 2002
INVENTOR(S)   : Willem Bulthuis It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-second Day of July, 2003

JAMES E. ROGAN
*Director of the United States Patent and Trademark Office*